US009991382B1

(12) United States Patent
Mochizuki et al.

(10) Patent No.: US 9,991,382 B1
(45) Date of Patent: Jun. 5, 2018

(54) VERTICAL FIELD EFFECT TRANSISTOR WITH ABRUPT EXTENSIONS AT A BOTTOM SOURCE/DRAIN STRUCTURE

(71) Applicant: International Business Machines Corporation, Armonk, NY (US)

(72) Inventors: Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/808,178

(22) Filed: Nov. 9, 2017

Related U.S. Application Data

(63) Continuation of application No. 15/492,797, filed on Apr. 20, 2017.

(51) Int. Cl.
  *H01L 29/78* (2006.01)
  *H01L 29/66* (2006.01)
  *H01L 29/06* (2006.01)
  *H01L 29/08* (2006.01)

(52) U.S. Cl.
  CPC ...... *H01L 29/7827* (2013.01); *H01L 29/0847* (2013.01); *H01L 29/6653* (2013.01); *H01L 29/66666* (2013.01)

(58) Field of Classification Search
  CPC ........... H01L 21/823821; H01L 21/845; H01L 27/0886; H01L 27/0924; H01L 27/10826; H01L 27/10879; H01L 27/1211; H01L 29/41791; H01L 29/66795–29/66818; H01L 29/785–29/7856; H01L 2924/13067; H01L 29/04–29/045; H01L 29/16–29/1608; H01L 29/01
  USPC ................. 438/283, 197; 257/288, 190, 401, 257/E29.255, 192

See application file for complete search history.

(56) References Cited

U.S. PATENT DOCUMENTS

| | | | |
|---|---|---|---|
| 6,426,259 B1 | 7/2002 | Yu | |
| 8,921,939 B2 * | 12/2014 | Johnson | H01L 29/0847 257/347 |
| 9,029,218 B2 | 5/2015 | Loh et al. | |
| 9,029,974 B2 | 5/2015 | Esteve et al. | |
| 9,202,920 B1 | 12/2015 | Liu et al. | |
| 2015/0014773 A1 * | 1/2015 | Cheng | H01L 29/0649 257/349 |

(Continued)

OTHER PUBLICATIONS

Anonymous, "Compressive Strained Vertical Transistor by Bottom Silicide Expansion", Publication Date May 3, 2016, 5 pages.

(Continued)

*Primary Examiner* — Jonathan Han
(74) *Attorney, Agent, or Firm* — Scully, Scott, Murphy & Presser, P.C.; Daniel P. Morris, Esq.

(57) ABSTRACT

A semiconductor structure is provided that includes a vertical transport field effect transistor located on sidewall surfaces of a semiconductor fin. The semiconductor structure further includes an abrupt junction that is located between a bottom source/drain extension region and a sidewall surface of a lower portion of the semiconductor fin. The bottom source/drain extension region is present in a gap that is located adjacent the lower portion of the semiconductor fin and atop a mesa portion of a base semiconductor substrate.

10 Claims, 12 Drawing Sheets

(56) References Cited

U.S. PATENT DOCUMENTS

2015/0041897 A1* 2/2015 Basker ............... H01L 29/7848
257/347
2015/0371892 A1* 12/2015 Xie .................. H01L 21/76224
257/401

OTHER PUBLICATIONS

Anonymous, "Method for Fabricating a Vertical FET with Air-Gap Top Spacer", Publication dated Mar. 28, 2016, 6 pages.
Anonymous, "Method of Fabrication of Strained-SiGe Vertical Transistor", Publication Date Jun. 5, 2014, 6 pages.
List of IBM Patents or Patent Applications Treated as Related, dated Nov. XX, 2017, 2 pages.
U.S. Appl. No. 15/492,797, filed Apr. 20, 2017.
Notice of Allowance dated Dec. 21, 2017 received in the parent U.S. Patent Application, namely U.S. Appl. No. 15/492,797.

* cited by examiner

VERTICAL FIELD EFFECT TRANSISTOR WITH ABRUPT EXTENSIONS AT A BOTTOM SOURCE/DRAIN STRUCTURE

BACKGROUND

The present application relates to a semiconductor structure and a method of forming the same. More particularly, the present application relates to a semiconductor structure including a vertical transport field effect transistor which includes an abrupt junction that is located at an interface of a bottom source/drain extension region and sidewall surfaces of a lower portion of a semiconductor fin, as well as a method of forming such a structure.

Conventional vertical transistors are devices where the source-drain current flows in a direction normal to the substrate surface. In such devices, a vertical semiconductor pillar (or fin) defines the channel with the source and drain located at opposing ends of the semiconductor pillar. Vertical transistors are an attractive option for technology scaling for 5 nm and beyond.

One potential drawback with conventional vertical transistors is that there is a difficulty in providing a bottom source/drain structure that contains an abrupt junction profile. Notably, and in some conventional processes of providing a bottom source/drain structure, a high thermal budget (on the order of 800° C. or greater) is required to drive-in dopants from the bottom source/drain structure into a semiconductor material portion that is adjoined to a semiconductor fin to form the bottom extension regions. Such a high thermal budget provides a broad dopant profile. There is thus a need for providing a vertical transistor structure which includes an abrupt junction that is located at an interface of a bottom source/drain extension region and sidewall surfaces of a lower portion of a semiconductor fin.

SUMMARY

A semiconductor structure is provided that includes a vertical transport field effect transistor located on sidewall surfaces of a semiconductor fin. The semiconductor structure further includes an abrupt junction that is located between a bottom source/drain extension region and sidewall surfaces of a lower portion of the semiconductor fin. The term "abrupt" when used in connection with the term "junction" denotes the sharpness of a concentration gradient of dopants at the junction, wherein the dopant profile is typically smaller than 5 nm/decade. The bottom source/drain extension region is present in a gap that is located adjacent the lower portion of the semiconductor fin and atop a mesa portion of a base semiconductor substrate.

In one aspect of the present application, a semiconductor structure is provided. In one embodiment, the semiconductor structure includes a base semiconductor substrate including a mesa portion. A semiconductor fin extends upward from a surface of the mesa portion, wherein the semiconductor fin has a width that is less than a width of the mesa portion. A bottom source/drain structure including a bottom source/drain extension region is located on physically exposed surfaces of the base semiconductor substrate and the mesa portion, wherein the bottom source/drain extension region contacts sidewall surfaces of a lower portion of the semiconductor fin and wherein an abrupt junction is present at an interface formed between the bottom source/drain extension region and the sidewall surfaces of the lower portion of the semiconductor fin. A gate structure is located along a portion of the sidewall surfaces of the semiconductor fin and separated from the bottom source/drain structure and the bottom source/drain extension region by a bottom spacer. A top spacer is located on the gate structure and contacting the sidewall surfaces of an upper portion of the semiconductor fin, and a top source/drain structure is located on a topmost surface of the semiconductor fin.

In another aspect of the present application, a method of forming a semiconductor structure is provided. In one embodiment, the method includes providing at least one semiconductor fin containing a hard mask cap and extending upward from a semiconductor substrate portion, wherein a dielectric layer is present on physically exposed surfaces of the semiconductor substrate portion. Next, a dielectric spacer is formed along sidewall surfaces of the at least one semiconductor fin and the hard mask cap and on a portion of the topmost surface of the dielectric layer. The semiconductor substrate portion is then recessed utilizing the dielectric spacer and the hard mask cap as an etch mask to provide a base semiconductor substrate containing at least one mesa portion. During the recessing, physically exposed portions of the dielectric layer are removed. Next, the dielectric layer that remains beneath the dielectric spacer is removed to provide a gap positioned between the dielectric spacer and the at least one mesa portion of the base semiconductor substrate and to physically expose the sidewall surfaces of a lower portion of the semiconductor fin. A bottom source/drain structure including a bottom source/drain extension is then formed, wherein the bottom source/drain extension region fills the gap and contacts the physically exposed sidewall surfaces of the lower portion of the at least one semiconductor fin. Next, the dielectric spacer is removed from the sidewall surfaces of the at least one semiconductor fin. A vertical gate structure is then formed. The vertical gate structure includes a bottom spacer located on the physically exposed surfaces of the bottom source/drain structure and the bottom source/drain extension, a gate structure along a portion of the physically exposed sidewall surfaces of the at least one semiconductor fin and atop the bottom spacer, and a top spacer above the gate structure and contacting the sidewall surfaces of an upper portion of the at least semiconductor fin. The hard mask cap is then removed, and thereafter, a top source/drain structure is formed from a physically exposed topmost surface of the at least one semiconductor fin.

DETAILED DESCRIPTION

Figure 1:
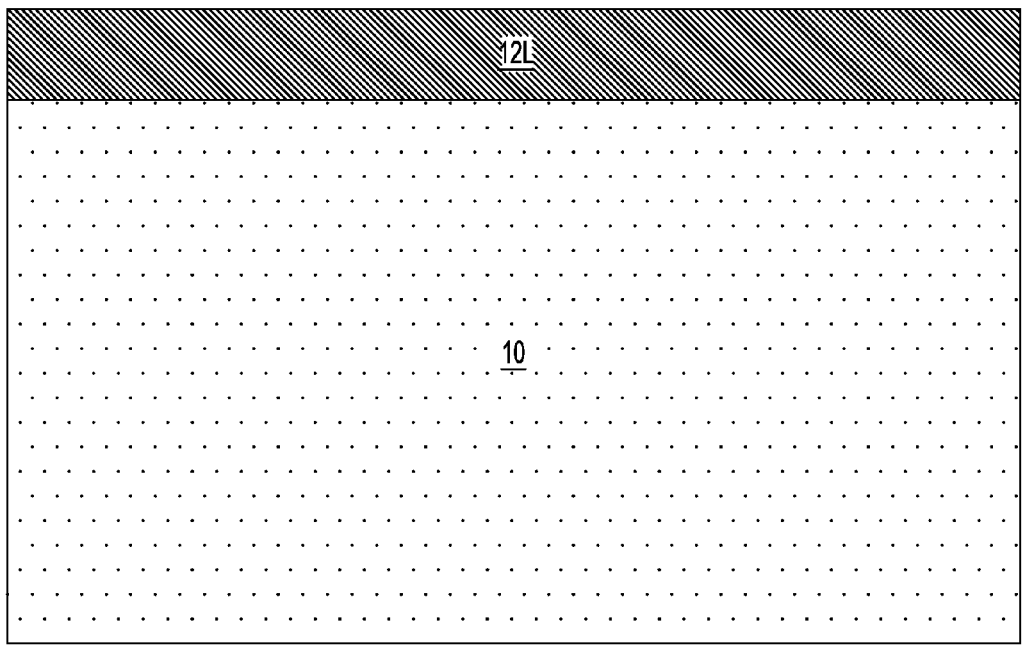
FIG. 1 is a cross sectional view of an exemplary semiconductor structure including a blanket layer of a dielectric hard mask material located on a surface of a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a blanket layer of a dielectric hard mask material (i.e., hard mask layer 12L) located on a surface of a semiconductor substrate 10 that can be employed in accordance with an embodiment of the present application.

The semiconductor substrate 10 that can be employed in the present application is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon. In some embodiments, the semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The hard mask layer 12L that can be used in the present application includes any dielectric hard mask material such as, for example, silicon dioxide, silicon nitride and/or silicon oxynitride. In one example, silicon nitride is employed as the dielectric hard mask material. The blanket layer of dielectric hard mask material (i.e., hard mask layer 12L) may be formed utilizing a deposition process such as, for example, chemical vapor deposition (CVD) and plasma enhanced chemical vapor deposition (PECVD). In some embodiments, the hard mask layer 12L may be formed by a thermal growth process such as, for example, thermal oxidation and/or thermal nitridation. In yet other embodiments, the hard mask layer 12L may be formed utilizing a combination of, and in any order, a deposition process and a thermal growth process. The hard mask layer 12L is a continuous layer (without any breaks or gaps) whose thickness may be from 20 nm to 100 nm. Other thicknesses that are lesser than, or greater than the aforementioned thicknesses values may also be employed as the thickness of the hard mask layer 12L.

Figure 2:
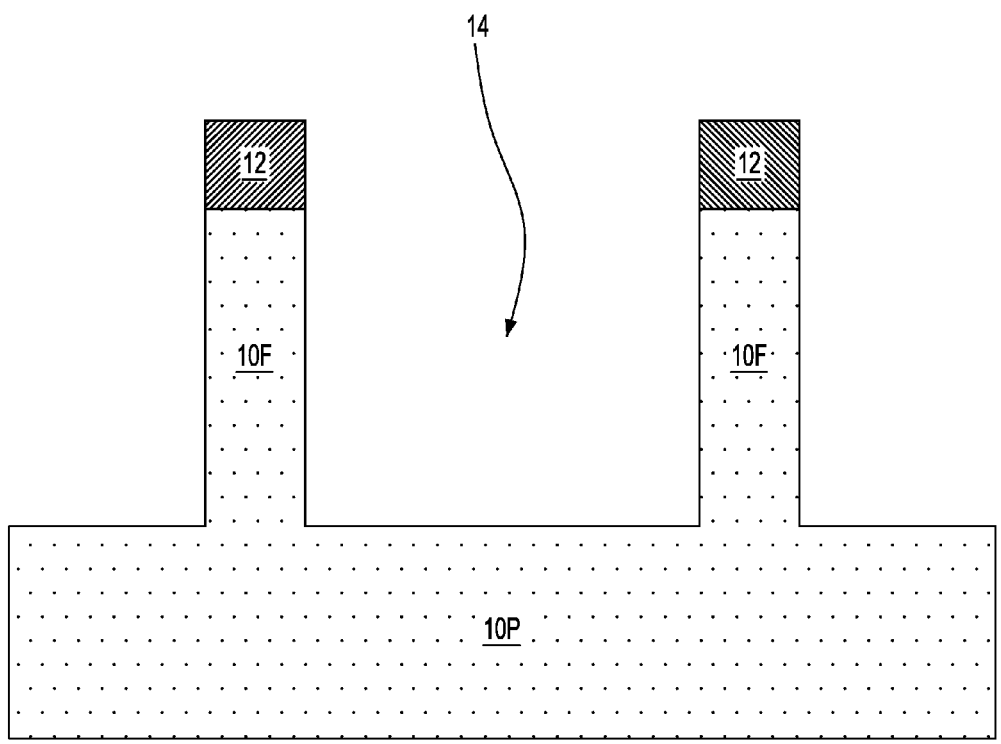
FIG. 2 is a cross sectional view of the exemplary semiconductor structure of FIG. 1 after patterning the blanket layer of dielectric hard mask material and the underlying semiconductor substrate to provide at least one semiconductor fin that includes a hard mask cap.

Referring now to FIG. 2, there is illustrated the exemplary semiconductor structure of FIG. 1 after patterning the blanket layer of dielectric hard mask material (i.e., hard mask layer 12L) and the underlying semiconductor substrate 10 to provide at least one semiconductor fin 10F that includes a hard mask cap 12. Each hard mask cap 12 that is formed constitutes a remaining, non-etched portion of the hard mask layer 12L. Each semiconductor fin 10F constitutes a remaining, non-etched portion of the semiconductor substrate 10 which is present directly beneath one of the hard mask caps 12. Although the present application describes and illustrates the formation of two semiconductor fins 10F that are capped with a hard mask cap 12, the present application can be employed when a single hard mask capped semiconductor fin structure (12/10F) is formed, or when more than two hard mask capped semiconductor fin structures (12/10F) are formed.

Each semiconductor fin 10F extends upward from a remaining portion of the semiconductor substrate 10. The remaining portion of the semiconductor substrate 10 is referred to herein as semiconductor substrate portion 10P. As is shown, each hard mask capped semiconductor fin structure (12/10F) contains a hard mask cap 12 whose sidewall surfaces are vertically aligned with the sidewall surfaces of an underlying semiconductor fin 10F.

In one embodiment, the patterning of the blanket layer of dielectric hard mask material (i.e., hard mask layer 12L) and the semiconductor substrate 10 may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., patterned transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the hard mask layer 12L. In other embodiments, the patterned photoresist is removed from the structure after the pattern has been transferred into both the hard mask layer 12L and the semiconductor substrate 10. In either embodiment, the patterned photoresist may be removed utilizing a conventional photoresist stripping process such as, for example, ashing.

In another embodiment, the patterning of the blanket layer of dielectric hard mask material (i.e., hard mask layer 12L) and the semiconductor substrate 10 may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the blanket layer of dielectric hard mask material (i.e., hard mask layer 12L) and the semiconductor substrate 10 may include a direct self-assembly (DSA) process in which a copolymer that is capable of direct self-assembly is used.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 10F has a height from 20 nm to 200 nm, and a width from 5 nm to 30 nm. Other heights and/or widths that are lesser than, or greater than, the ranges mentioned herein can also be used in the present application. Each semiconductor fin 10F is spaced apart from its nearest neighboring semiconductor fin 10F by a pitch of from 20 nm to 100 nm; the pitch is measured from one point of one semiconductor fin to the exact point on a neighboring semiconductor fin. Also, each semiconductor fin 10F is oriented parallel to each other. An opening 14 is present between each neighboring pairs of semiconductor fins 10F.

Figure 3:
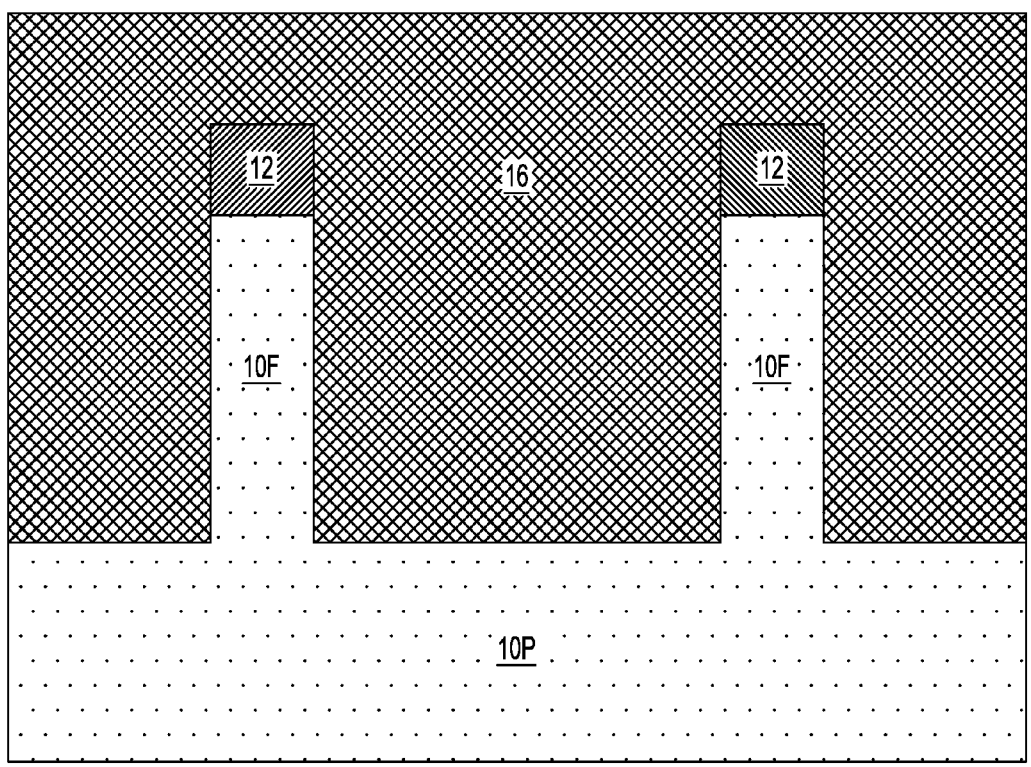
FIG. 3 is a cross sectional view of the exemplary semiconductor structure of FIG. 2 after forming a dielectric structure surrounding the at least one semiconductor fin and each hard mask cap and on a remaining portion of the semiconductor substrate.

Referring now to FIG. 3, there is illustrated the exemplary semiconductor structure of FIG. 2 after forming a dielectric structure 16 surrounding each hard mask capped semiconductor fin structure (12/10F) and on a remaining portion of the semiconductor substrate (i.e., semiconductor substrate portion 10P. The dielectric structure 16 fills in the opening 14 shown in FIG. 2.

The dielectric structure 16 has a height that is greater than a height of each hard mask capped semiconductor fin structure (12/10F). Stated in other terms, a topmost surface of the dielectric structure 16 is vertically offset and located above a topmost surface of each hard mask capped semiconductor fin structure (12/10F).

The dielectric structure 16 may include any dielectric material provided that the dielectric material is different than the dielectric hard mask material of each hard mask cap 12. In one example, and when each hard mask cap 12 is composed of silicon nitride, the dielectric structure 16 is composed of a dielectric oxide such as, for example, silicon dioxide. The dielectric structure 16 can be formed by providing a dielectric material utilizing any conventional deposition processes such as, for example, chemical vapor deposition or plasma enhanced chemical vapor deposition. In some embodiments, and following the deposition of the dielectric material, a material removal process such as, for example, chemical mechanical polishing, may be used to provide the dielectric structure 16.

Figure 4:
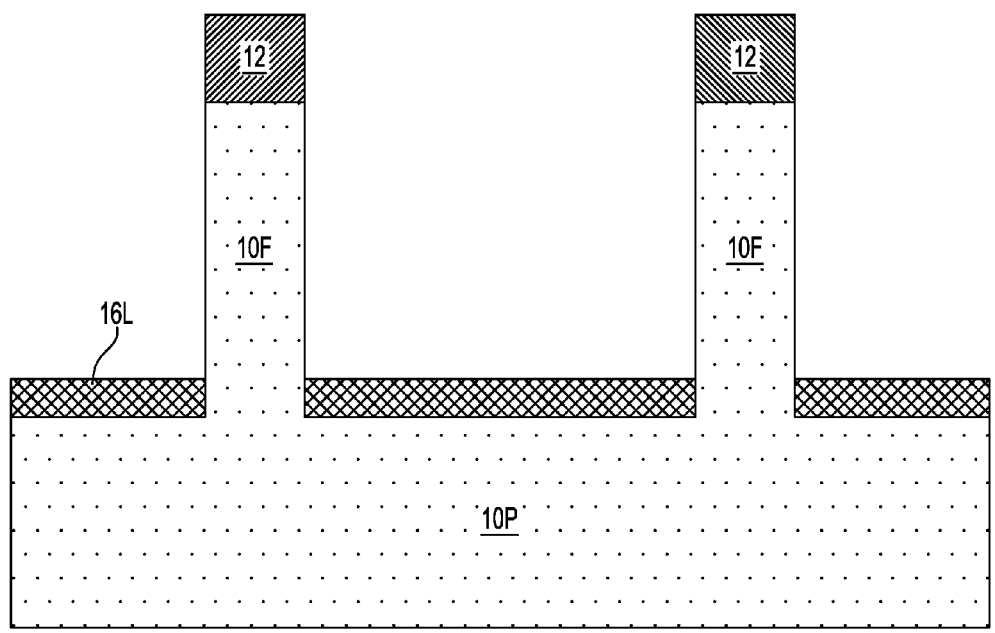
FIG. 4 is a cross sectional view of the exemplary semiconductor structure of FIG. 3 after performing a recess etch on the dielectric structure to provide a dielectric layer that contacts sidewall surfaces of a lower portion of the at least one semiconductor fin.

Referring now to FIG. 4, there is illustrated the exemplary semiconductor structure of FIG. 3 after performing a recess etch on the dielectric structure 16 to provide a dielectric layer 16L. As is shown, dielectric layer 16L contacts sidewall surfaces of a lower portion of the at least one semiconductor fin 10F. The dielectric layer 16L has a height that is less than a height of each hard mask capped semiconductor fin structure (12/10F). Stated in other terms, a topmost surface of the dielectric layer 16L is vertically offset and located beneath the topmost surface of each hard mask capped semiconductor fin structure (12/10F). The recess etch removes the dielectric material of the dielectric structure 16 selective to the dielectric material that provides each hard mask cap 12 and the semiconductor material that provides each semiconductor fin 10F. In one example, and when silicon dioxide is employed as the dielectric material of the dielectric structure 16 and silicon nitride is employed as each hard mask cap 12, hydrofluoric acid or a buffered oxide etchant (i.e., a mixture of ammonium fluoride and hydrofluoric acid) may be used during the recess etch process.

Figure 5:
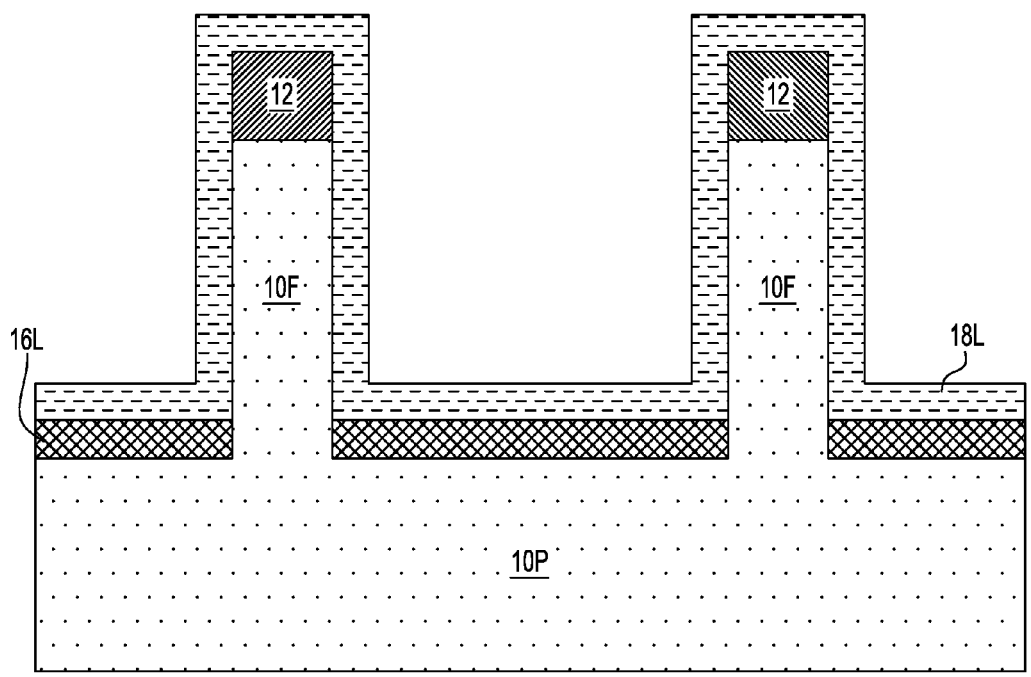
FIG. 5 is a cross sectional view of the exemplary semiconductor structure of FIG. 4 after forming a dielectric spacer material layer.

Referring now to FIG. 5, there is illustrated the exemplary semiconductor structure of FIG. 4 after forming a dielectric spacer material layer 18L. The dielectric spacer material layer 18L is a continuous layer that is formed on physically exposed surfaces of the dielectric layer 16L and each hard mask capped semiconductor fin structure (12/10F).

In one embodiment, the dielectric spacer material layer 18L is a conformal layer. By "conformal" it is meant that a material layer has a first thickness as measured from a bottom surface to a topmost surface that is the same as a second thickness as measured from an inner sidewall surface to an outer sidewall surface. In another embodiment, the dielectric spacer material layer 18L may be non-conformal layer. The dielectric spacer material layer 18L may be formed utilizing a deposition process such as, for example, chemical vapor deposition (CVD) or atomic layer deposition (ALD). In either embodiment, the dielectric spacer material layer 18L does not entirely fill in the opening that remains between each neighboring semiconductor fin 10F.

The dielectric spacer material layer 18L is composed of any dielectric spacer material provided that the dielectric spacer material is different, in terms of composition, than the dielectric material that provides dielectric layer 16L. The dielectric spacer material may be the same as, or different from, the hard mask material that provides each hard mask cap 12. In one example, silicon nitride is employed as the dielectric material of both the dielectric spacer material and the hard mask material that provides the hard mask cap 12, while silicon dioxide is employed as the dielectric material than provides dielectric layer 16L.

Figure 6:
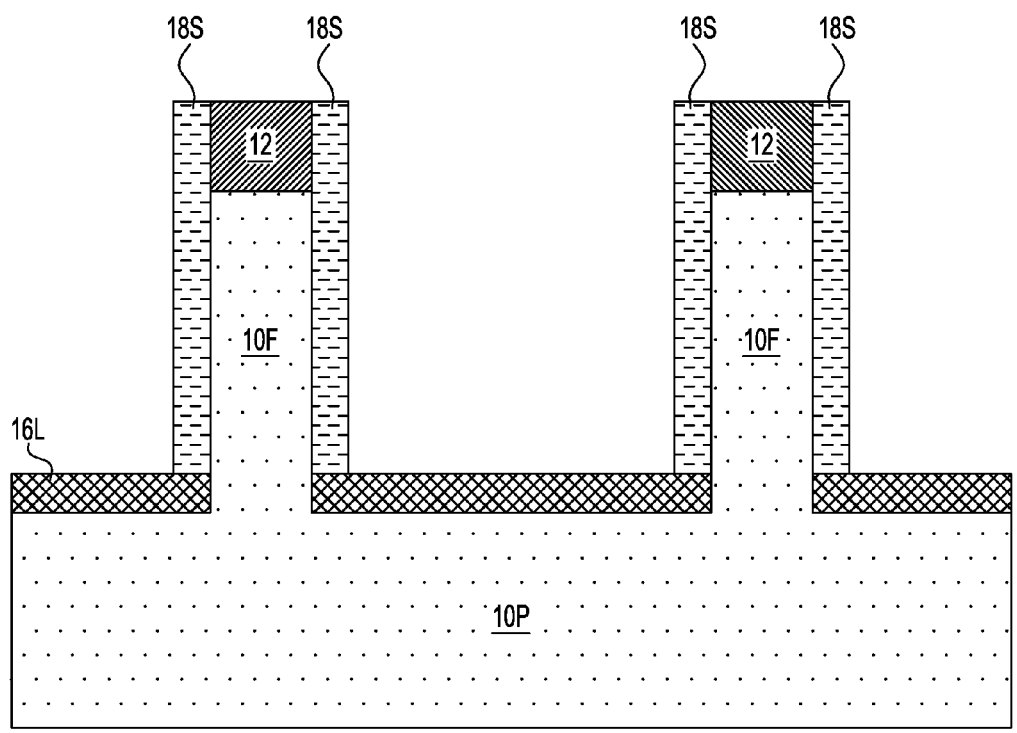
FIG. 6 is a cross sectional view of the exemplary semiconductor structure of FIG. 5 after etching the dielectric spacer material layer to provide a dielectric spacer along the sidewall surfaces of the at least one semiconductor fin and the hard mask cap.

Referring now to FIG. 6, there is illustrated the exemplary semiconductor structure of FIG. 5 after etching the dielectric spacer material layer 18L to provide a dielectric spacer 18S along the sidewall surfaces of the at least one semiconductor fin 10F and each hard mask cap 12. As is shown, the topmost surface of each dielectric spacer 18S is coplanar with a topmost surface of each hard mask cap 12. As is further shown, the bottommost surface of each dielectric spacer 18S is located on a portion of the topmost surface of the dielectric layer 16L.

The etch used to provide the dielectric spacer 18S includes any spacer etch that removes the horizontal portions of the dielectric spacer material layer 18L, but not the vertical portions of the dielectric spacer material layer 18L. In one embodiment, the etch used to provide the dielectric spacers 18S is a reactive ion etch.

Figure 7:
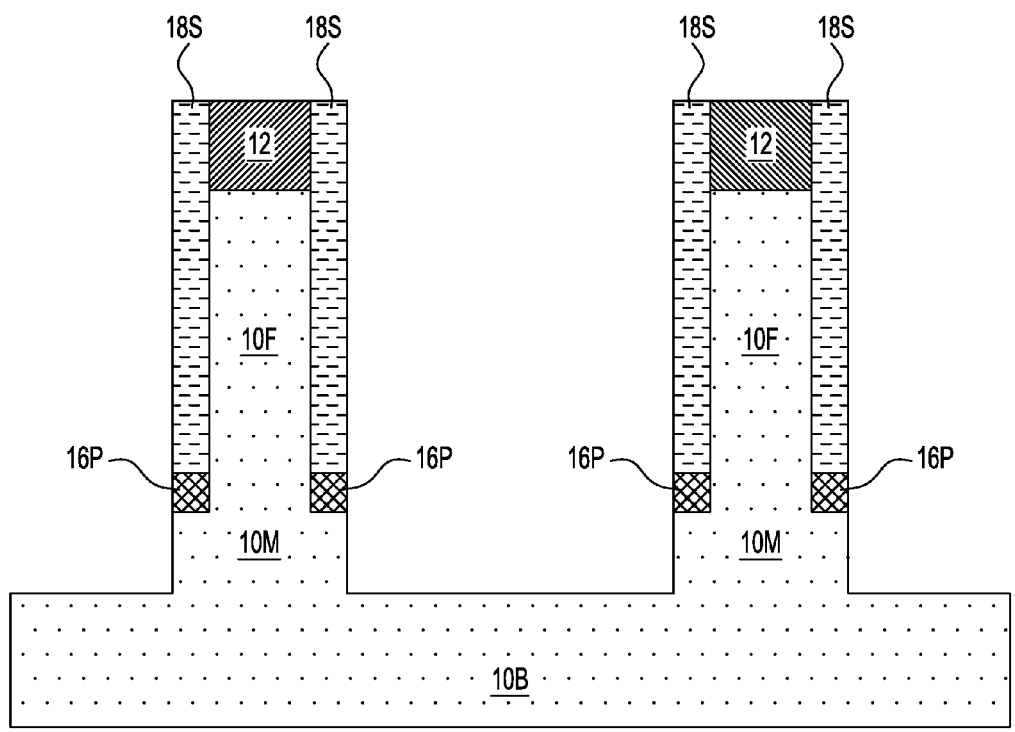
FIG. 7 is a cross sectional view of the exemplary semiconductor structure of FIG. 6 after recessing a remaining portion of the semiconductor substrate to provide a base semiconductor substrate containing at least one mesa portion utilizing the dielectric spacer and the hard mask cap as an etch mask.

Referring now to FIG. 7, there is illustrated the exemplary semiconductor structure of FIG. 6 after recessing a remaining portion of the semiconductor substrate (i.e., the semiconductor material portion 10P) to provide a base semiconductor substrate 10B containing at least one mesa portion 10M utilizing the dielectric spacer 18S and the hard mask cap 12 as an etch mask. During this recessing step, portions of the dielectric layer 16L that are not protected by the dielectric spacer 18L are removed, while maintaining a portion of the dielectric layer 16L (hereinafter dielectric layer portion 16P) that is present directly beneath the dielectric spacer 18S. The recessing may be performed utilizing an anisotropic etching process such as, for example, reactive ion etching.

Each mesa portion 10M that is formed has a width that is greater than a width of the overlying semiconductor fin 10F. In one example, each mesa portion 10M has a width from 10 nm to 50 nm. Each mesa portion 10M may have a thickness of from 5 nm to 50 nm. Each mesa portion 10M that is formed has outer sidewall surfaces that are vertically aligned to the outer sidewall surface of the dielectric spacer 18S, and the outermost sidewall surface of the dielectric layer portion 16P. In addition to having its outermost sidewall surface vertically aligned to the outermost sidewall surface of the dielectric spacer 18S, each dielectric layer portion 16P has an innermost sidewall surface that is vertically aligned to the innermost sidewall surface of the dielectric spacer 18S, as well as the sidewall surfaces of the semiconductor fin 10F.

Figure 8:
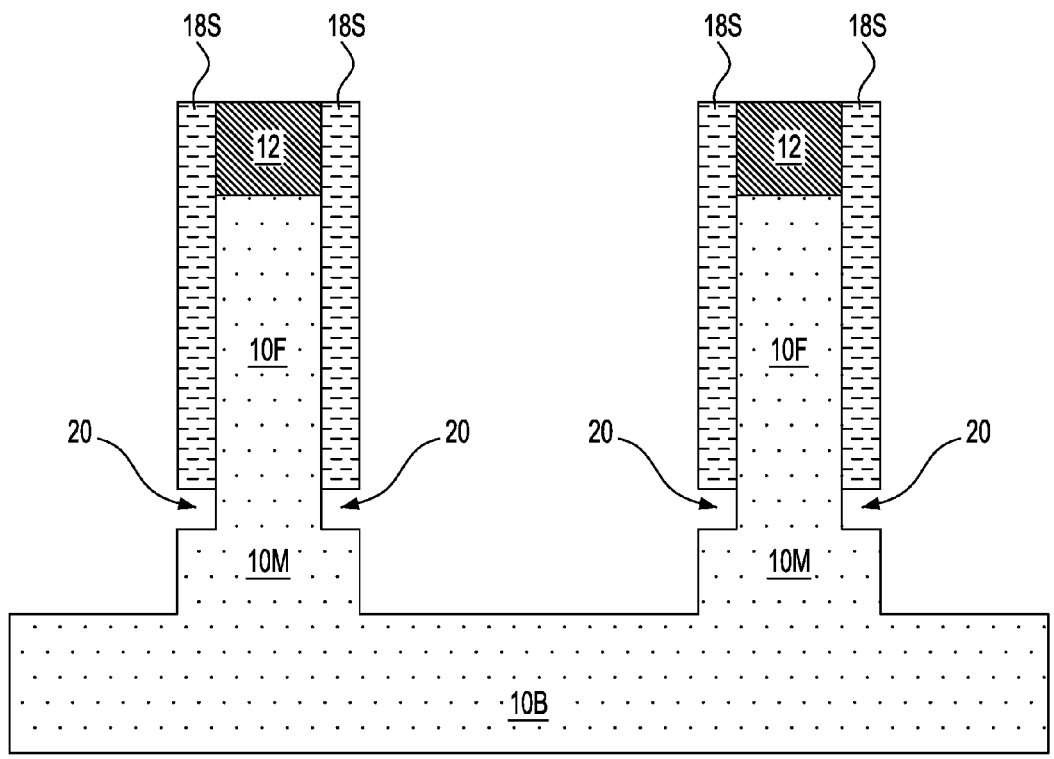
FIG. 8 is a cross sectional view of the exemplary semiconductor structure of FIG. 7 after removing remaining portions of the dielectric layer that are present beneath the dielectric spacer to provide a gap positioned between the dielectric spacer and the at least one mesa portion of the base semiconductor substrate.

Referring now to FIG. 8, there is illustrated the exemplary semiconductor structure of FIG. 7 after removing the remaining portions of the dielectric layer (i.e., each dielectric layer portion 16P) to provide a gap 20 positioned between the dielectric spacer 18S and the at least one mesa portion 10M of the semiconductor substrate. Each dielectric layer portion 16P may be removed utilizing an etch that is selective in removing the dielectric material that provides each dielectric layer portion 16P relative to the dielectric material that provides the dielectric spacer 18S, and the hard mask cap 12. In one example, hydrofluoric acid can be used to remove each dielectric layer portion 16P. Each gap 20 that is formed physically exposes sidewall surfaces of a lower portion of the semiconductor fin 10F.

Figure 9:
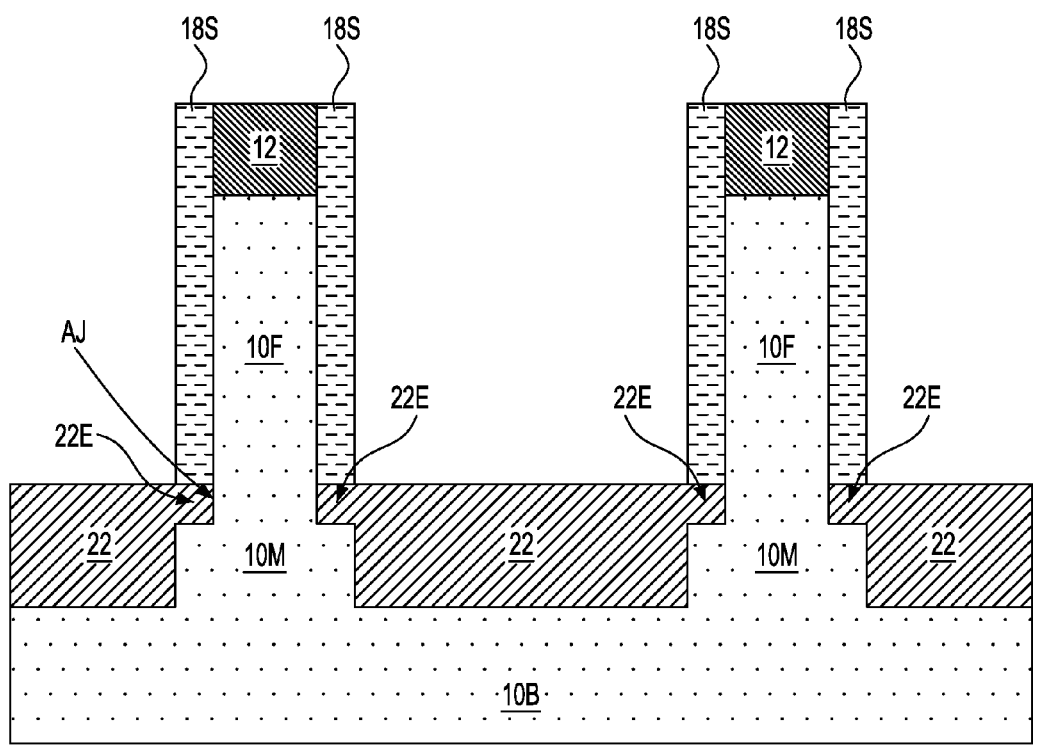
FIG. 9 is a cross sectional view of the exemplary semiconductor structure of FIG. 8 after forming a bottom source/drain structure including a bottom source/drain extension, wherein the bottom source/drain extension region fills the gap and contacts sidewall surfaces of a lower portion of the at least one semiconductor fin.

Referring now to FIG. 9, there is illustrated the exemplary semiconductor structure of FIG. 8 after forming a bottom source/drain structure 22 including a bottom source/drain extension 22E, wherein the bottom source/drain extension region 22E fills the gap 20 and contacts the sidewall surfaces of the lower portion of the at least one semiconductor fin 10F. An abrupt junction AJ is present at an interface formed between the bottom source/drain extension region 22E and the sidewall surfaces of the lower portion of the semiconductor fin 10F.

The bottom source/drain structure 22 including the bottom source/drain extension 22E can be formed utilizing an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the bottom source/drain structure 22 including the bottom source/drain extension 22E has an epitaxial relationship with the physically exposed sidewall surface of the semiconductor fin 10F, the mesa portion 10M and the base semiconductor substrate 10B.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined below) is typically added to the precursor gas or gas mixture. No separate high temperature anneal is necessary in the present application in forming the bottom source/drain extension 22E.

The bottom source/drain structure 22 including the bottom source/drain extension 22E is of single construction, and each contains a semiconductor material that is doped. The semiconductor material that provides the bottom source/drain structure 22 including the bottom source/drain extension 22E may be the same as, or different from, the semiconductor material of each semiconductor fin 10F. In one example, the bottom source/drain structure 22 including the bottom source/drain extension 22E and the semiconductor fins 10F are all composed of silicon. The dopant that is present in the semiconductor material that provides the bottom source/drain structure 22 including the bottom source/drain extension 22E may include a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment, the concentration of n-type or p-type dopant within the semiconductor material that provides the bottom source/drain structure 22 including the bottom source/drain extension 22E is of single construction can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

Figure 10:
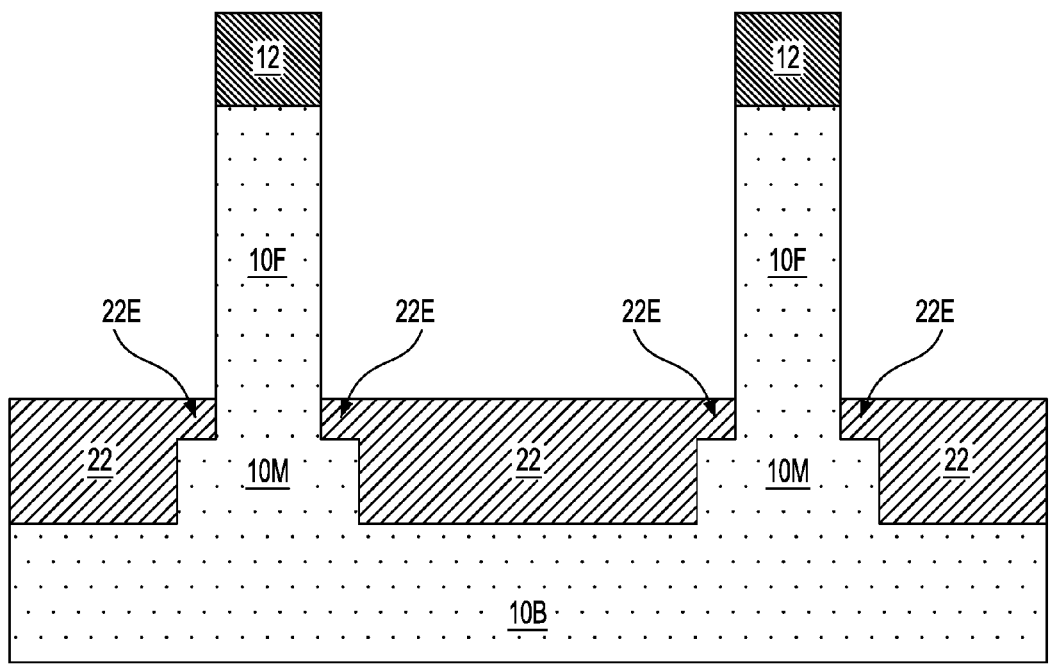
FIG. 10 is a cross sectional view of the exemplary semiconductor structure of FIG. 9 after removing the dielectric spacer from sidewall surfaces of the at least one semiconductor fin.

Referring now to FIG. 10, there is illustrated the exemplary semiconductor structure of FIG. 9 after removing the dielectric spacer 18S from sidewall surfaces of the at least one semiconductor fin 10F. The dielectric spacer 18S may be removed utilizing an etching process such as, for example, a reactive ion etching and a wet etching. During this etch, a portion, but not the entirety, of each hard mask cap 12 may be removed.

Figure 11:
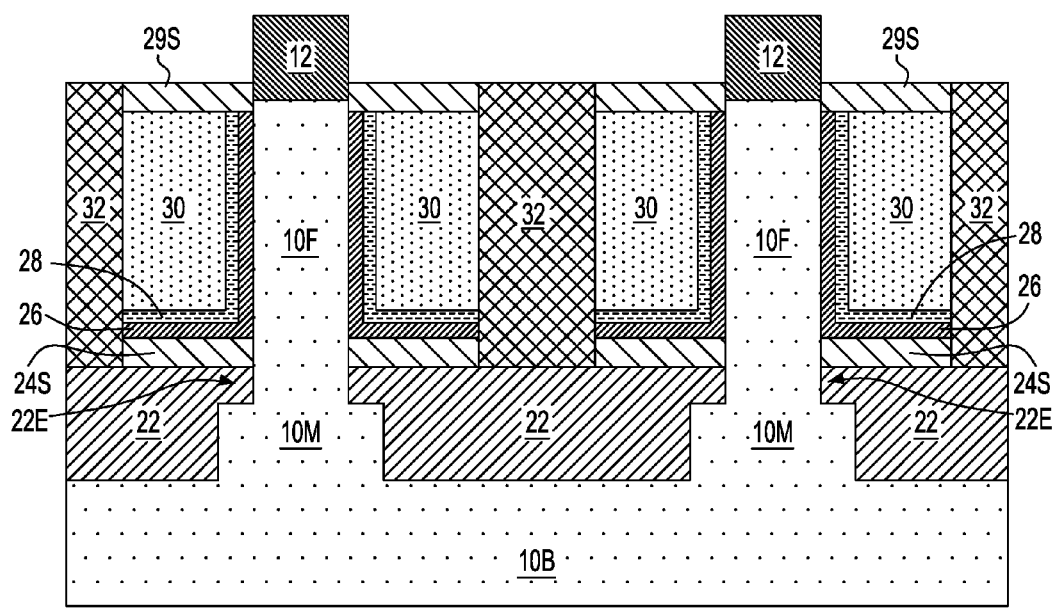
FIG. 11 is a cross sectional view of the exemplary semiconductor structure of FIG. 10 after forming a bottom spacer, a gate structure, a top spacer and a first middle-of-the-line (MOL) dielectric material.

Referring now to FIG. 11, there is illustrated the exemplary semiconductor structure of FIG. 10 after forming a bottom spacer 24S, a gate structure (26, optional 28, 30), a top spacer 29S, and a first middle-of-the-line (MOL) dielectric material 32.

The bottom spacer 24S is formed on the physically exposed portion of the topmost surface of the bottom source/drain structure 22 including the bottom source/drain extension 22E. The bottom spacer 24S contacts sidewall surfaces of the lower portion of the semiconductor fin 10F. The bottom spacer 24S may be composed of any dielectric spacer material including for example, silicon dioxide, silicon nitride or silicon oxynitride. The bottom spacer 24S may be formed utilizing a deposition process such as, for example, chemical vapor deposition or plasma enhanced chemical vapor deposition. In some instances, an etch back process may follow the deposition of the dielectric spacer material that provides the bottom spacer 24S. The bottom spacer 24S may have a thickness from 4 nm to 10 nm. Other thicknesses that are lesser than, or greater than, the aforementioned thickness range may also be employed in the present application as the thickness of the bottom spacer 24S.

The gate structure (26, optional 28, 30) includes a gate dielectric 26, an optional workfunction metal 28, and gate electrode 30. The gate structure (26, optional 28, 30) can be formed by deposition of the various material layers that provide the gate structure and then performing a patterning process such as, lithography and etching.

The gate dielectric 26 may be composed of a gate dielectric material such as, for example, an oxide, nitride, and/or oxynitride. In one example, the gate dielectric 26 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as gate dielectric 26. The gate dielectric material that provides the gate dielectric 26 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that provides the gate dielectric 26 can have a thickness in a range from 1 nm to 10 nm. Other thicknesses that are lesser than, or greater than, the aforementioned thickness range can also be employed for the gate dielectric material that provides the gate dielectric 26.

The optional workfunction metal 28 may include a p-type workfunction metal or an n-type workfunction metal. Such workfunction metals are known to those skilled in the art and may include a metal nitride, a metal carbide or a combination thereof. Exemplary metal nitrides that can be employed in as the workfunction metal 28 include, but are not limited to, TiN, HfN, HfSiN, TaN, TaSiN, WN, MoN or NbN. Exemplary metal carbides that can be employed as the workfunction metal 28 include, but are not limited to, TiC, TaC or HfC. The workfunction metal may be formed utilizing conventional deposition techniques well known to those skilled in the art. In one embodiment of the present application, the workfunction metal 28 can have a thickness in a range from 5 nm to 20 nm. Other thicknesses that are lesser than, or greater than, the aforementioned thickness range can also be employed for the gate dielectric material that provides the workfunction metal 28.

The gate conductor 30 includes a gate conductor material. The gate conductor material used in providing the gate conductor 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material used in providing the gate conductor 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor 30 can have a thickness from 50 nm to 200 nm. Other thicknesses that are lesser than, or greater than, the aforementioned thickness range can also be employed for the gate conductor 30.

When multiple gate structures are formed, it is possible to provide a first set of gate structures that can be used as a n-type transistor, while providing a second set of gate structures that can be used as a p-type transistor.

The top spacer 29S is formed on the physically exposed topmost surface of the gate structure (26, optional 28, 30) and contacts sidewall surfaces of an upper portion of the least one semiconductor fin 10F. The top spacer 29S may be composed of one of the dielectric spacer materials mentioned above for the bottom spacer 24S; the top spacer 29S is composed of a different dielectric material than the hard mask cap 12. In one embodiment, the top spacer 29S is composed of a same dielectric spacer material as the bottom spacer 24S. For example, the top spacer 29S and the bottom spacer 24S may each be composed of silicon dioxide. The top spacer 29S may be formed utilizing a deposition process such as, for example, chemical vapor deposition or plasma enhanced chemical vapor deposition. In some instances, an etch back process may follow the deposition of the dielectric spacer material that provides the top spacer 29S. The top spacer 29S may have a thickness from 4 nm to 10 nm. Other thicknesses that are lesser than, or greater than, the aforementioned thickness range may also be employed in the present application as the thickness of the top spacer 29S. Collectively, the bottom spacer 24S, the gate structure (26, optional 28, 30) and the top spacer 29S may be referred to as a vertical gate structure.

The first MOL dielectric material 32 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the first MOL dielectric material 32. The use of a self-planarizing dielectric material as the first MOL dielectric material 32 may avoid the need to perform a subsequent planarizing step.

In one embodiment, the first MOL dielectric material 32 can be formed utilizing a deposition process including, for example, chemical vapor deposition (CVD), plasma enhanced chemical vapor deposition (PECVD), evaporation or spin-on coating. In some embodiments, a planarization process and/or an etch back process follows the deposition of the first MOL dielectric material 32. The first MOL dielectric material 32 that can be employed in the present application may vary depending on the type of material employed as well as the method that was employed in forming the same. In one embodiment, the first MOL dielectric material 32 has a thickness from 30 nm to 150 nm. Other thicknesses that are greater or lesser than the range provided above can also be used for the first MOL dielectric material 32. The first MOL dielectric material 32 has sidewall surfaces that contact an outermost sidewall of the gate structure (26, optional 28, 30); the innermost sidewall of the gate structure (26, optional 28, 30), which constitutes a vertical portion of the gate dielectric 26, is in direct physically contact with a portion of the sidewall surfaces of the semiconductor fin 10F. The first MOL dielectric material 32 has a topmost surface that is coplanar with a topmost surface of the top spacer 29S, and a bottommost surface that is located on a physically exposed surface of the base semiconductor substrate 10B.

FIG. 11 illustrates an exemplary semiconductor structure in accordance with the present application. Notably, the exemplary semiconductor structure includes a base semiconductor substrate 10B including a mesa portion 10M. A semiconductor fin 10F extends upward from a surface of the mesa portion 10M, wherein the semiconductor fin 10F has a width that is less than a width of the mesa portion 10M. A bottom source/drain structure 22 including a bottom source/drain extension region 22E is located on physically exposed surfaces of the base semiconductor substrate 10B and the mesa portion 10M, wherein the bottom source/drain extension region 22E contacts sidewall surfaces of a lower portion of the semiconductor fin 10F and wherein an abrupt junction AJ is present at an interface formed between the bottom source/drain extension region 22E and the sidewall surfaces of the lower portion of the semiconductor fin 10F. A gate structure (26, optional 28, 30) is located along a portion of the sidewall surfaces of the semiconductor fin 10F and separated from the bottom source/drain structure 22 and the bottom source/drain extension region 22E by a bottom spacer 24S. A top spacer 29S is located on the gate structure (26, optional 28, 30) and contacting the sidewall surfaces of an upper portion of the semiconductor fin 10F. A top source/drain structure 34 is located on a topmost surface of the semiconductor fin 10F. It is noted that the base semiconductor substrate 10B, the mesa portion 10M, and the semiconductor fin 10F are of uniform construction (i.e., a single piece) that are composed of a same semiconductor material.

Figure 12:
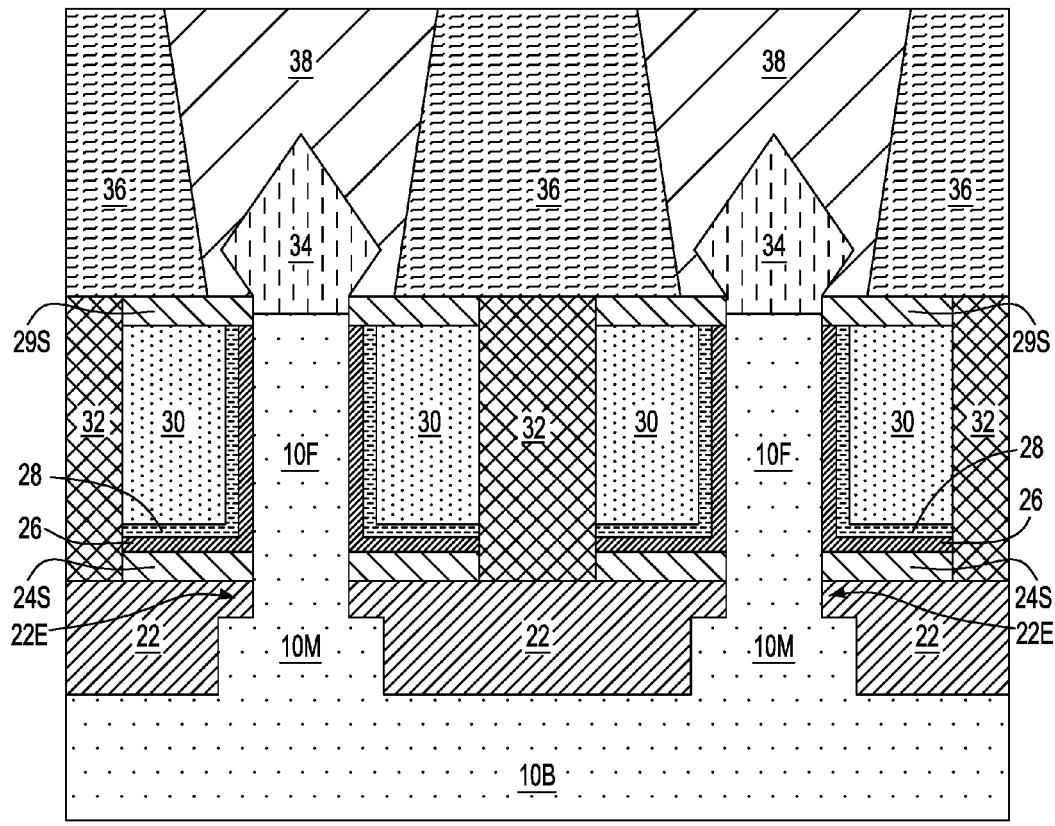
FIG. 12 is a cross sectional view of the exemplary semiconductor structure of FIG. 11 after removing the at least one hard mask cap, forming a top source/drain structure from a physically exposed topmost surface of the at least one semiconductor fin, and forming a second MOL dielectric material which contains a contact metal or metal structure.

Referring now to FIG. 12, there is illustrated the exemplary semiconductor structure of FIG. 11 after removing the at least one hard mask cap 12, forming a top source/drain structure 34 from a physically exposed topmost surface of the at least one semiconductor fin 10F, and forming a second MOL dielectric material 36 which contains a contact metal or metal alloy structure 38.

Each hard mask cap 12 may be removed utilizing an etching process that is selective in removing the dielectric hard mask material. In one example, reactive ion etching can be used to remove each hard mask cap 12. After removing the hard mask cap 12, a topmost surface of the semiconductor fin 10F is physically exposed.

A top source/drain structure 34 then formed from the physically exposed topmost surface of the at least one semiconductor fin 10F. The top source/drain structure 34 may be formed utilizing an epitaxial growth process as described above. The top source/drain structure 34 includes a semiconductor material and an n-type or p-type dopant as defined above for the bottom source/drain structure 22. The concentration of dopant with the top source/drain structure 34 may be within the range mentioned above for the bottom source/drain structure 22. The conductivity type of the bottom and top source/drain structures is the same. The top source/drain structure 34 has faceted surfaces. That is, the top source/drain structure 34 has a surfaces that are not planar. In the illustrated example, the top source/drain structure 34 is diamond-shaped.

After forming the top source/drain structure 34, the second MOL dielectric material 36 is formed. The second MOL dielectric material 36 may, or may not, be composed of the same dielectric material as the first MOL dielectric material 32. The second MOL dielectric material 36 may be formed utilizing one of the techniques mentioned above in forming the first MOL dielectric material 32.

After providing the second MOL dielectric material 36, a contact opening is formed that physically exposes at least the top source/drain structure 34. The contact opening can be formed by lithography and etching. Next, the contact opening can be filled with a contact metal or metal alloy and thereafter a planarization process may be used to provide the contact metal or metal alloy structure 38. In some embodiments, the contact opening and thus the contact metal or metal alloy structure 38 have tapered sidewalls as is shown in FIG. 12. The contact metal or metal alloy may include copper, tungsten, cobalt or alloys thereof. In some embodiments, a metal semiconductor alloy such as a metal silicide can be formed on physically exposed surfaces of the top source/drain structure 34. In such an embodiment, the metal semiconductor alloy may represent a portion of the contact metal or metal alloy structure 38 shown in the drawing. As is shown, the contact metal or metal alloy structure has a topmost surface that is coplanar with a topmost surface of the second MOL dielectric material.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
providing at least one semiconductor fin containing a hard mask cap and extending upward from a semiconductor substrate portion, wherein a dielectric layer is present on physically exposed surfaces of the semiconductor substrate portion;
forming a dielectric spacer along sidewall surfaces of the at least one semiconductor fin and the hard mask cap and on a portion of the topmost surface of the dielectric layer;
recessing the semiconductor substrate portion utilizing the dielectric spacer and the hard mask cap as an etch mask to provide a base semiconductor substrate containing at least one mesa portion, wherein during the recessing, physically exposed portions of the dielectric layer which are located beneath the dielectric spacer are removed;
removing the dielectric layer that remains beneath the dielectric spacer to provide a gap positioned between the dielectric spacer and the at least one mesa portion of the base semiconductor substrate and to physically expose the sidewall surfaces of a lower portion of the semiconductor fin;
forming a bottom source/drain structure including a bottom source/drain extension, wherein the bottom source/drain extension region fills the gap and contacts the physically exposed sidewall surfaces of the lower portion of the at least one semiconductor fin;
removing the dielectric spacer from sidewall surfaces of the at least one semiconductor fin;
forming a vertical gate structure comprising a bottom spacer on the physically exposed surfaces of the bottom source/drain structure and the bottom source/drain extension, a gate structure along a portion of the physically exposed sidewall surfaces of the at least one semiconductor fin and atop the bottom spacer, and a top spacer above the gate structure and contacting the sidewall surfaces of an upper portion of the at least semiconductor fin;
removing the hard mask cap; and
forming a top source/drain structure from a physically exposed topmost surface of the at least one semiconductor fin.

2. The method of claim 1, wherein the at least one semiconductor fin is present on the at least one mesa portion.

3. The method of claim 2, wherein the at least one mesa portion has a width that is greater than a width of the at least one semiconductor fin.

4. The method of claim 1, wherein the gate structure comprises a gate dielectric and a gate conductor, wherein a vertical portion of the gate dielectric is in direct physical contact with the sidewall surfaces of the semiconductor fin.

5. The method of claim 4, further comprising a workfunction metal positioned between the gate dielectric and the gate conductor.

6. The method of claim 1, wherein the base semiconductor substrate, the mesa portion and the semiconductor fin are of uniform construction and are composed of a same semiconductor material.

7. The method of claim 1, wherein the dielectric layer has a topmost surface is vertically offset and is located beneath the topmost surface of the at least one semiconductor fin.

8. The method of claim 7, wherein the dielectric layer is formed by depositing a dielectric structure and then recessing the dielectric structure.

9. The method of claim 1, wherein the forming the bottom source/drain structure and the bottom source/drain extension comprises epitaxial deposition of a doped semiconductor material.

10. The method of claim 1, wherein the forming the top source/drain structure comprises epitaxial deposition of a doped semiconductor, and wherein the top source/drain structure has a faceted surfaces.

\* \* \* \* \*